United States Patent

Unami et al.

[11] Patent Number: 5,962,956
[45] Date of Patent: Oct. 5, 1999

[54] PIEZOELECTRIC RESONATOR AND ELECTRONIC COMPONENT CONTAINING SAME

[75] Inventors: Toshihiko Unami, Omihachiman; Takashi Yamamoto, Ishikawa-ken; Shigemasa Kusabiraki, Takoaka; Toshiyuki Baba, Moriyama; Tetsuo Takeshima, Toyama; Hirohide Yoshino, Toyama-ken, all of Japan

[73] Assignee: Murata Manufacturing Co., Ltd., Kyoto, Japan

[21] Appl. No.: 08/846,295

[22] Filed: Apr. 30, 1997

[51] Int. Cl.⁶ .................................................. H01L 41/08
[52] U.S. Cl. .......................... 310/366; 310/368; 310/328; 310/348
[58] Field of Search .................................... 310/328, 348, 310/366–368

[56] References Cited

U.S. PATENT DOCUMENTS

| | | | |
|---|---|---|---|
| 2,157,665 | 5/1939 | Hollmann | 310/315 |
| 2,998,535 | 8/1961 | Church et al. | 310/325 |
| 3,185,869 | 5/1965 | Shoor | 310/315 |
| 3,187,207 | 6/1965 | Tomes | 310/325 |
| 3,297,889 | 1/1967 | Breskend | 310/315 |
| 3,390,287 | 6/1968 | Sonderegger | 310/328 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,608,509 | 8/1986 | Yamamoto et al. | 310/344 X |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/366 |
| 5,126,618 | 6/1992 | Takahashi et al. | 310/346 |
| 5,153,477 | 10/1992 | Jomura et al. | 310/328 |
| 5,225,731 | 7/1993 | Owen | 310/366 |

(List continued on next page.)

FOREIGN PATENT DOCUMENTS 5-160459  6/1993  Japan ..................... 310/366

*Primary Examiner*—Mark O. Budd
*Attorney, Agent, or Firm*—Graham & James LLP

[57] ABSTRACT

A piezoelectric resonator having a small spurious resonance, a large frequency difference ΔF between the resonant frequency and the anti-resonant frequency, adjustable capacitance, and high design flexibility includes a base member formed by laminating, for example, a plurality of piezoelectric layers and internal electrodes. When the length, width, and thickness of the base member are indicated by L, W and T, respectively, the dimensions of the member are selected to satisfy the conditions of L≧2W and L≧2T. The base member is polarized at both ends of each internal electrode in opposite directions. A groove is preferably formed on one lateral surface of the base member, and at both sides of the groove, the internal electrodes are alternately covered with two insulating films. The two insulating films are respectively formed to cover the different internal electrodes. External electrodes are formed on both sides of the groove of the base member and are connected to the internal electrodes.

14 Claims, 12 Drawing Sheets

U.S. PATENT DOCUMENTS

| | | | |
|---|---|---|---|
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

PIEZOELECTRIC RESONATOR AND ELECTRONIC COMPONENT CONTAINING SAME

BACKGROUND OF THE INVENTION

1. Field of the Invention

The present invention relates generally to piezoelectric resonators and electronic components containing such resonators. More particularly, the invention relates to a piezoelectric resonator which makes maximum use of the mechanical resonance of a piezoelectric member vibrating in the longitudinal vibration mode. The invention also relates to electronic components, such as filters, discriminators, and oscillators, using the above type of piezoelectric resonator.

2. Description of the Related Art

FIG. 15 is a perspective view of a typical conventional piezoelectric resonator. A piezoelectric resonator generally indicated by 1 has a single piezoelectric substrate 2 having, for example, a rectangular planar shape, as viewed from above. The single substrate 2 is polarized in the thickness direction. Electrodes 3 are formed on two opposite major surfaces of the single substrate 2. A signal is input between the electrodes 3 so as to apply an electric field to the single substrate 2 along its thickness, causing the single substrate 2 to vibrate in the longitudinal direction. Also, in FIG. 16. there is shown a piezoelectric resonator 1 in which electrodes 3 are formed on two opposite major surfaces of a single piezoelectric substrate 2 having a square planar shape, as viewed from above. In this resonator 1, as well as the resonator 1 shown in FIG. 15, the single piezoelectric substrate 2 is polarized in the thickness direction. A signal is input between the electrodes 3 of the resonator 1 so as to apply an electric field to the single substrate 2 along its thickness, thereby causing the single substrate 2 to vibrate in the square-type vibration mode.

These piezoelectric resonators 1 of FIGS. 15 and 16 are of an unstiffened type, in which the direction of vibration differs from the direction of polarization and the direction of the electric field. The electromechanical coupling coefficient of such an unstiffened piezoelectric resonator is lower than that of a stiffened piezoelectric resonator, in which each of the direction of vibration, the direction of polarization, and the direction in which an electric field is applied, are the same. Accordingly, an unstiffened resonator has a relatively small frequency difference ΔF between the resonant frequency and the anti-resonant frequency. This leads to a drawback in which a bandwidth in use is narrow when an unstiffened frequency resonator is used as a filter or an oscillator. Thus, flexibility and freedom in designing the resonator characteristics is limited in the above type of piezoelectric resonator and in electronic components containing such a resonator.

The piezoelectric resonator 1 shown in FIG. 15 utilizes the first-order resonance in the longitudinal mode. At the same time, however, the resonator 1 also generates, due to its structure, large spurious resonances in the odd-number-order higher harmonic modes, such as the third-order and fifth-order modes, and in the width mode. Some solutions to suppress or prevent these spurious resonances have been considered, such as polishing, increasing mass, and changing the shape of the electrode. These solutions, however, increase the manufacturing cost.

Additionally, since the piezoelectric substrate has a rectangular planar shape, the thickness of the substrate cannot be reduced due to limitations imposed by a minimum required strength. Accordingly, the distance between the electrodes cannot be reduced and a capacitance between terminals cannot be substantially increased. This makes it extremely difficult for achieving impedance matching with an external circuit. Further, to form a ladder filter by connecting a plurality of piezoelectric resonators alternately in series and in parallel, the capacitance ratio of the series resonator to the parallel resonator needs to be large in order to increase attenuation. However, large attenuation cannot be obtained due to limitations in the shape and arrangement of the resonators as described above, resulting in severe limitations on the flexibility of the resonator and component characteristics, such as the frequency difference ΔF and the capacitance.

In the piezoelectric resonator 1 illustrated in FIG. 16, large spurious resonances such as those in the thickness mode and in the triple-wave mode in the plane direction are generated. Further, since this type of resonator must have a large size as compared with a piezoelectric resonator using longitudinal vibration in order to obtain the same resonant frequency, it is difficult to reduce the size of the resonator shown in FIG. 16. Also, when a ladder filter is formed by a plurality of piezoelectric resonators, in order to increase the capacitance ratio between the series resonator and the parallel resonator, the resonators connected in series have increased thickness, and electrodes are formed only on part of a piezoelectric substrate to decrease the capacitance. In this case, since the electrodes are only partially formed, not only the capacitance, but also the difference ΔF between the resonant frequency and the anti-resonant frequency, are reduced. The resonators connected in parallel are accordingly required to have a small frequency difference ΔF. As a consequence, the piezoelectricity of the piezoelectric substrate cannot be effectively used, and the pass bandwidth of the filter cannot be increased.

To solve the above problems, a laminated piezoelectric resonator was proposed by the present inventor, for example, in Japanese Patent Application No. 8-122725 which corresponds to Applicants' co-pending U.S. patent application No. Ser. 08/829,880, (Attorney Docket No. 36856.27) for "PIEZOELECTRIC RESONATOR AND ELECTRONIC COMPONENT CONTAINING SAME"; the disclosures of which applications are incorporated herein by reference. This resonator is a stiffened type, in which each of the direction of vibration and the direction in which an electric field is applied are the same. The resonator has more factors that contribute to desirable filter characteristics, such as the width and thickness of the resonator, and the number of laminated layers used in the resonator, as compared with a known type of piezoelectric resonator formed of only a single substrate.

Then, an examination was made whether improved filter characteristics would be obtained by adjusting the above-described factors when this type of laminated piezoelectric resonator is provided in an electronic component, such as a ladder filter. Through this study it was revealed that the frequency difference ΔF is seriously decreased, and spurious resonances are increased, depending on the dimensions, such as the length, width and thickness, of the resonator. This further proves that the determination of the dimensions of the resonator is an important factor.

SUMMARY OF THE INVENTION

The preferred embodiments of the present invention provide a piezoelectric resonator having a small spurious resonance, a large difference ΔF between the resonant frequency and the anti-resonant frequency, adjustable capacitance, and high flexibility of designing the resonator characteristics. The preferred embodiments of the present invention also relate to an electronic component containing such an improved piezoelectric resonator.

According to one preferred embodiment of the present invention, there is provided a piezoelectric resonator comprising: a base member; a plurality of internal electrodes disposed within the base member in such a manner that they are substantially perpendicular to a longitudinal direction of the base member; and a pair of external electrodes provided on the same lateral surface or different lateral surfaces of the base member so as to be connected to the plurality of internal electrodes, the base member having a laminated structure in which a plurality of piezoelectric layers and the plurality of electrodes are alternately laminated, the piezoelectric layers being polarized in the longitudinal direction of the base member and generating longitudinal basic vibration in the base member when an electric field in the longitudinal direction of the base member is applied using the internal electrodes, wherein the dimensions of the piezoelectric resonator are selected to satisfy the conditions of L24 2W and L24 2T when the length, width, and thickness of the piezoelectric resonator are indicated by L, W and T, respectively.

In the above type of piezoelectric resonator, the plurality of electrodes may be formed to cover the entire cross sectional surface of the base member, and a pair of connecting portions may be disposed by covering at least part of the electrodes exposed from the lateral surface of the base member with alternate insulating films, the pair of external electrodes being disposed on the pair of connecting portions, whereby the electrodes adjacent to each other may be connected to the external electrodes, respectively.

Further, the plurality of electrodes may be partially formed in such a manner that they are not exposed at the lateral surface of the base member, and the exposed portions of the electrodes may be connected to the pair of external electrodes, whereby the electrodes adjacent to each other may be connected to the external electrodes, respectively.

According to another preferred embodiment of the present invention, there is provided an electronic component using the aforedescribed piezoelectric resonator, the electronic component comprising: a support substrate for supporting the piezoelectric resonator; a support member disposed between the piezoelectric resonator and the support substrate for supporting the piezoelectric resonator on the support substrate; and a cap disposed on the support substrate to cover the piezoelectric resonator.

Additionally, in the above-described electronic component, a ladder filter may be produced by connecting a plurality of the foregoing piezoelectric resonators on the support substrate.

In the above piezoelectric resonator, since the dimensions of the resonator are set to satisfy the conditions of $L/W \geq 2$ and $L/T \geq 2$, $\Delta F/F_a$ is increased, and spurious resonances are decreased. Through the investigation of the present inventor, FIG. 4 shows that $\Delta F/F_a$ is sharply decreased if L is smaller than about two times W. Similarly, FIG. 5 indicates that $\Delta F/F_a$ sharply drops if L is smaller than about two times T. Further, FIGS. 6 and 7 reveal that smaller spurious resonances can be achieved when L/W and L/T are substantially equal to 4 as compared with a case when L/W and L/T are equal to 1.

Moreover, an electronic component, such as a filter, a discriminator, or an oscillator, using the piezoelectric resonator according to the preferred embodiments can be produced by the following process. The resonator is mounted on a support substrate on which pattern electrodes are provided, and the resonator is then covered with a cap. Thus, a chip-type electronic component can be completed. During this process, the resonator can be mounted on the pattern electrodes disposed on the support substrate without needing to use a lead wire by virtue of the surface bonding structure. Additionally, support members may be formed at the approximate center of the base member, and thus, a node of the resonator located at center thereof can be securely supported when the resonator is mounted on the pattern electrodes.

The preferred embodiments of the present invention achieve the following advantages. When the length, width, and thickness of the piezoelectric resonator are indicated by L, W and T, respectively, the dimensions of the resonator are selected to satisfy the conditions of $L \geq 2W$ and $L \geq 2T$. Accordingly, a difference between the resonant frequency and the anti-resonant frequency, i.e., $\Delta F$, can be increased. It is thus possible to obtain a piezoelectric resonator having small spurious resonances and to obtain an electronic component containing such an improved resonator.

Also, in this piezoelectric resonator, it is possible to adjust $\Delta F$ unlike conventional piezoelectric resonators, which further makes it possible to regulate the bandwidth of the resonator. Additionally, since the capacitance of the resonator is adjustable, it is easy to achieve impedance matching with an external circuit in a case when the resonator is mounted on, for example, a circuit board. Namely, in the preferred embodiments of this invention, $\Delta F$ and the capacitance are adjustable, and thus, a piezoelectric resonator having high flexibility in designing the resonator characteristics and an electronic component containing such a resonator is provided.

Moreover, an electronic component containing this resonator can be produced with reduced cost because the resonator is preferably connected via support members to the pattern electrodes formed on a support substrate without needing to use a lead wire. The support members may be provided for the piezoelectric resonator, so that vibrations of the resonator are not impeded, thereby obtaining piezoelectric components having good characteristics. In particular, by utilizing a plurality of piezoelectric resonators, a ladder filter exhibiting greatly improved resonator characteristics can be produced with reduced cost.

Since a chip-type electronic component can be made by the use of the piezoelectric resonator according to the preferred embodiments, it can be readily mounted on a circuit board. In this electronic component, as well as the above piezoelectric resonator, the capacitance can be regulated by constructing the resonator with a laminated structure, and it is easy to achieve impedance matching between such a component and an external circuit. Additionally, in a ladder filter formed by alternately connecting a plurality of piezoelectric resonators in series and in parallel, attenuation can be adjusted by changing the ratio of the capacitance of the resonators connected in series to the capacitance of the resonators connected in parallel.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

A preferred embodiment of the present invention will now be described while referring to the accompanying drawings.

Figure 1A:
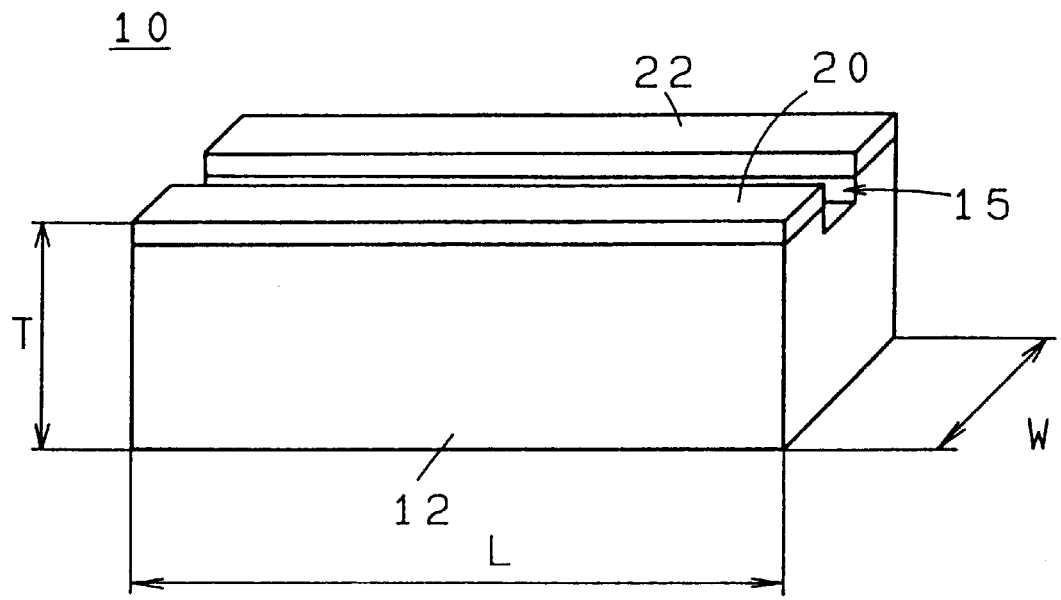
FIG. 1A is a perspective view of a piezoelectric resonator according to a preferred embodiment of the present invention.
Figure 1B:
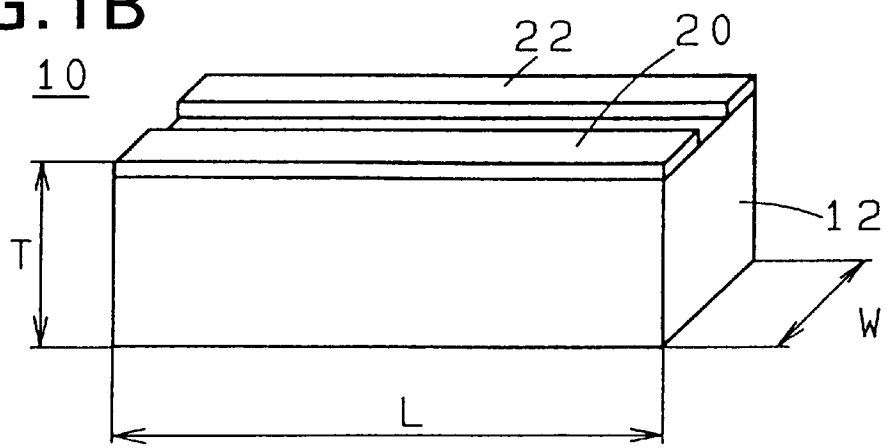
FIG. 1B is a perspective view of an example of modifications of the piezoelectric resonator shown in FIG. 1A.
Figure 2:
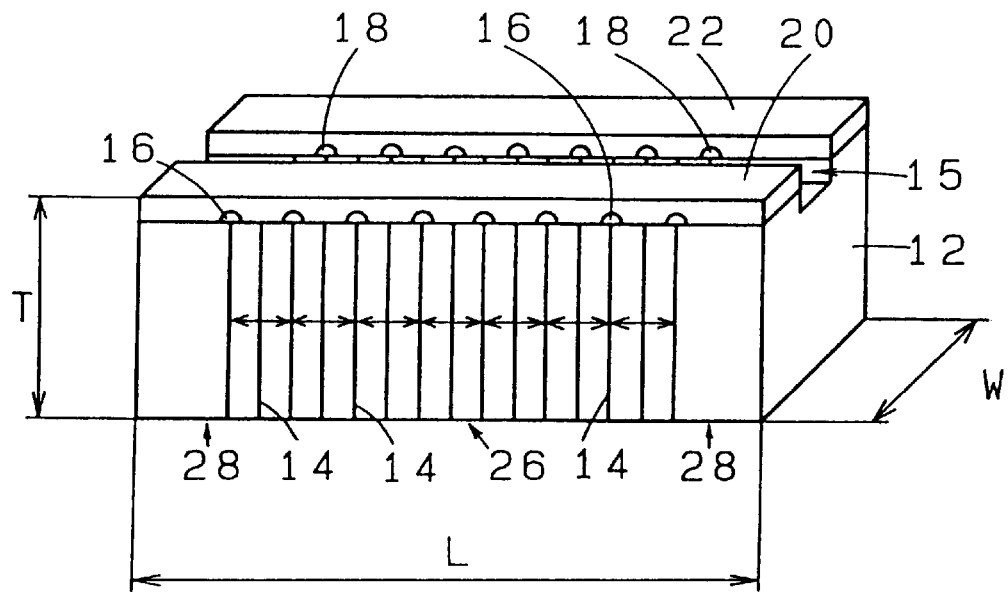
FIG. 2 illustrates the internal construction of the piezoelectric resonator shown in FIGS. 1A and 1B.

A reference will first be made to FIGS. 1A, 1B and 2 illustrating a piezoelectric resonator according to a preferred embodiment of the present invention. A piezoelectric resonator generally designated by 10, preferably has a substantially rectangular planar shape and includes a base member 12 preferably formed, for example, to have a substantially rectangular-prism shape. The base member 12 is made from, for example, a piezoelectric ceramic material. A plurality of internal electrodes 14 are disposed in the base member 12 in such a manner that the surfaces of the electrodes 14 are substantially perpendicular to a longitudinal direction of the base member 12. The base member 12 is longitudinally polarized so that the directions of polarization are opposite to each other at both sides of each electrode 14, as indicated by the arrows in FIG. 2.

The dimensions of the base member 12 are preferably determined in the following manner. When the length, width, and thickness of the base member 12 are indicated by L, W and T, respectively, the dimensions of the base member 12 are preferably set to satisfy the conditions of $L \geq 2W$ and $L \geq 2T$.

Figure 3:
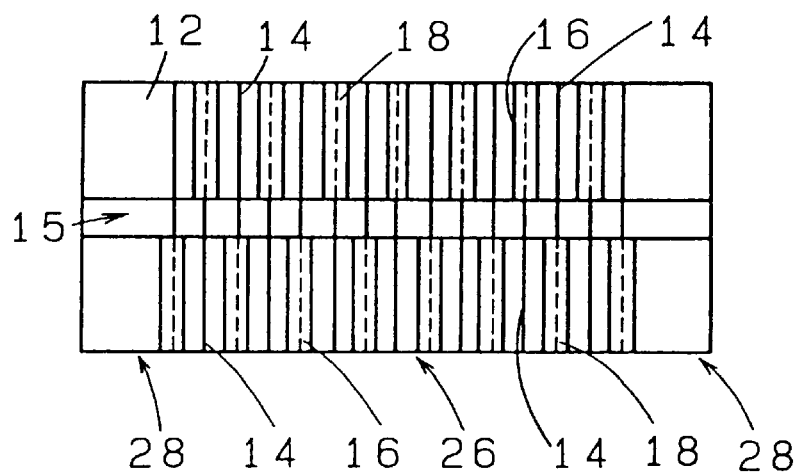
FIG. 3 is a plan view of the piezoelectric resonator shown in FIGS. 1A and 1B having insulating films on the base members.
Figure 4:
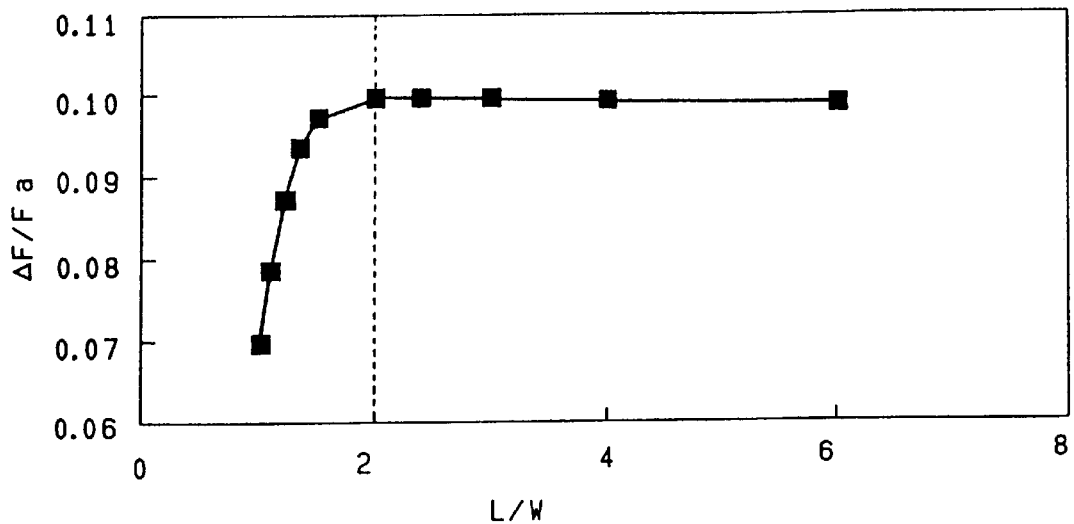
FIG. 4 is a diagram illustrating the relationship between the dimension ratio L/W and the frequency difference ratio $\Delta F/F_a$ of a piezoelectric resonator.
Figure 5:
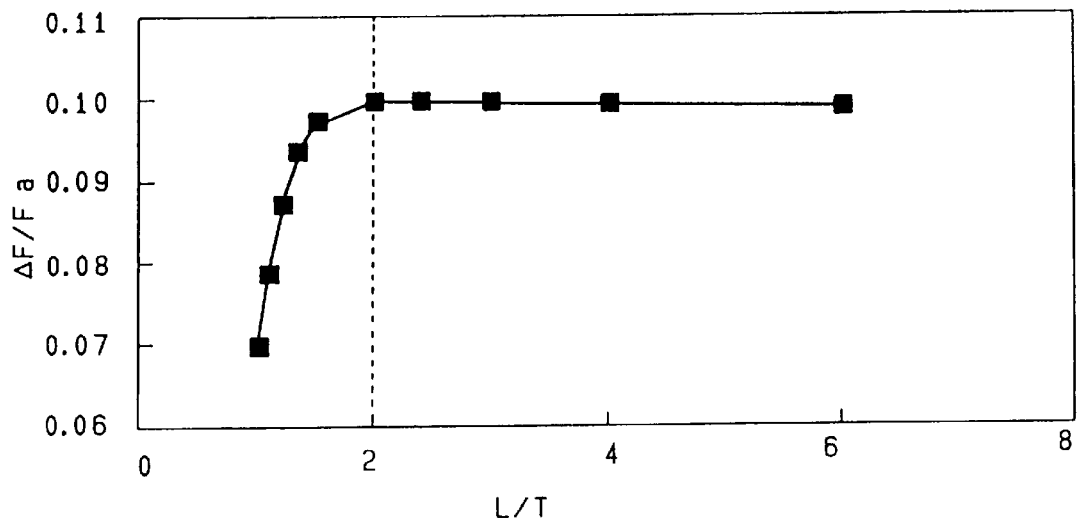
FIG. 5 is a diagram illustrating the relationship between the dimension ratio L/T and the frequency difference ratio $\Delta F/F_a$ of a piezoelectric resonator.
Figure 6:
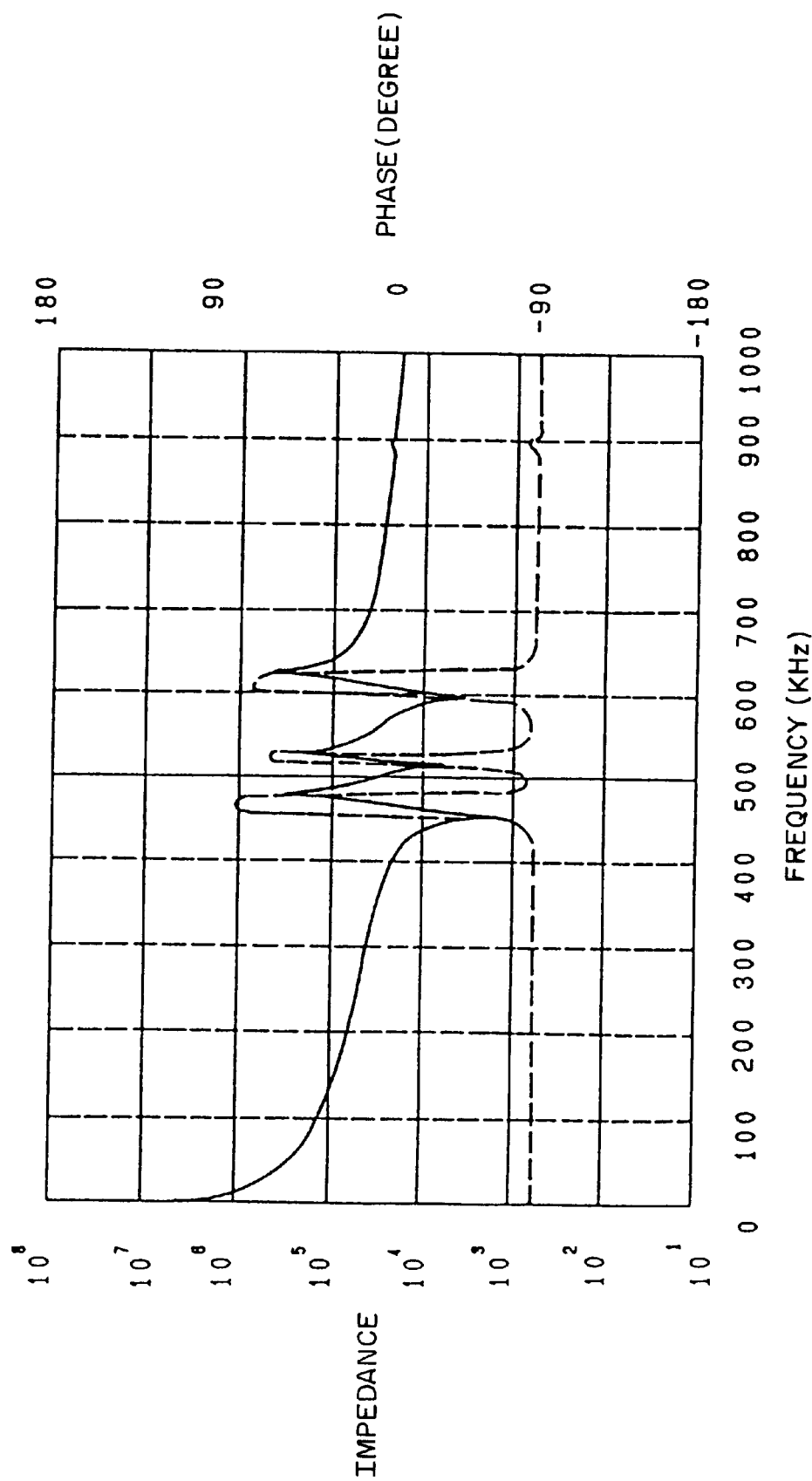
FIG. 6 is a diagram illustrating the relationship between the frequency and the impedance of a piezoelectric resonator when L/W is equal to 1.
Figure 7:
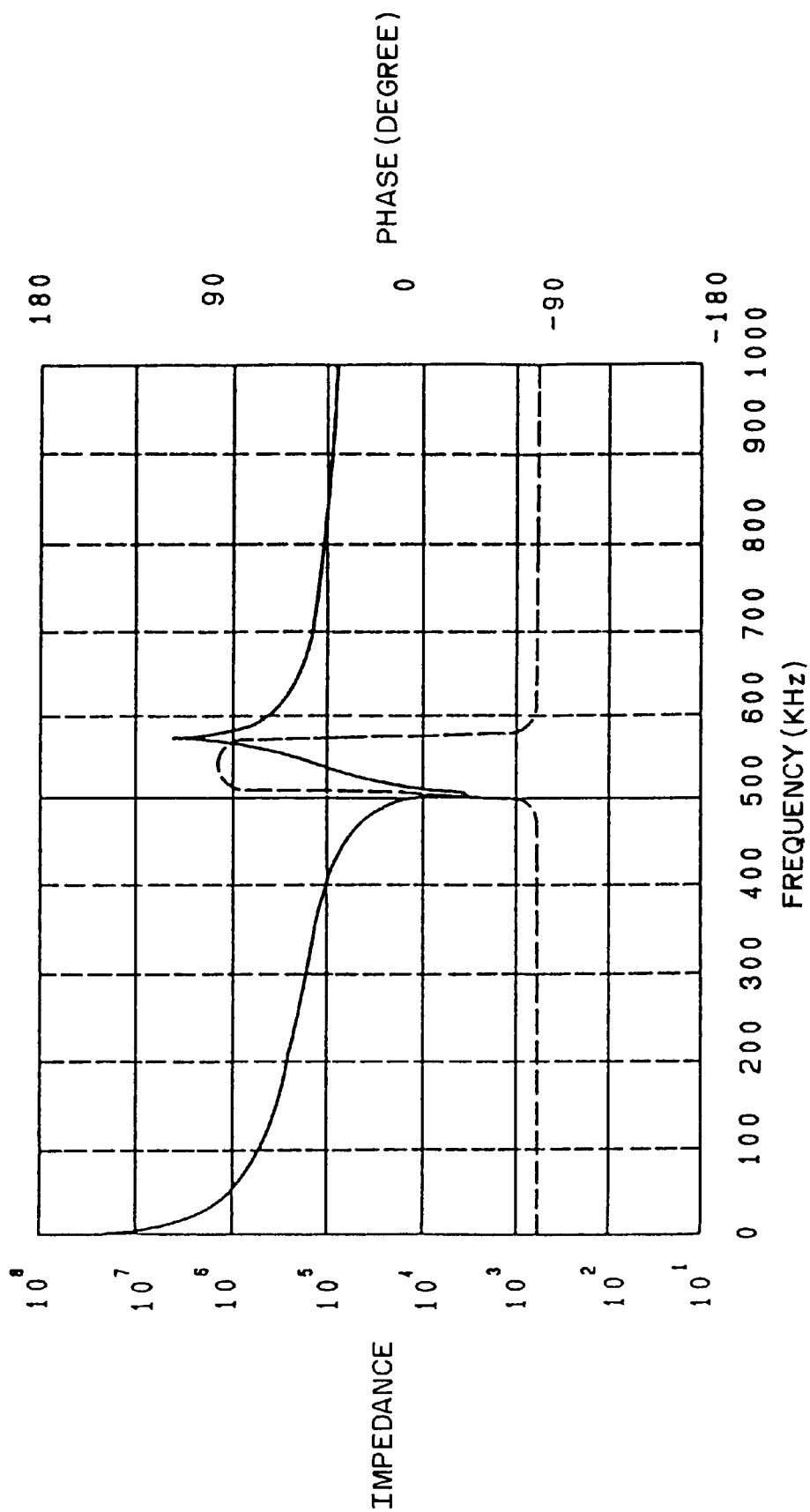
FIG. 7 is a diagram illustrating the relationship between the frequency and the impedance of a piezoelectric resonator when L/W is substantially equal to 4.

A groove 15 is preferably formed in one lateral surface of the base member 12 and preferably extends in the longitudinal direction of the base member 12. The groove 15 is preferably formed in the approximate central portion of the base member 12 in a widthwise direction so as to divide one lateral surface of the base member 12 into two portions. Further, a first insulating film 16 and a second insulating film 18 are provided, as illustrated in FIG. 3, on the lateral surface divided by the groove 15. On one side surface of the divided lateral surface of the base member 12, the first insulating film 16 covers the exposed sections of every other electrode 14. On the other side surface of the base member 12, the second insulating film 18 covers the exposed sections of every other electrode 14 which are not covered by the first insulating film 16. It should be noted that both ends of the base member 12 are preferably not polarized.

Moreover, external electrodes 20 and 22 are preferably disposed on the lateral surface on which the first and second insulating films 16 and 18 are located, i.e., on both sides of the groove 15. Thus, the electrode 20 is connected to the internal electrodes 14 which are not covered with the first insulating film 16, while the electrode 22 is connected to the internal electrodes 14 which are not covered with the second insulating film 18. Namely, two adjacent electrodes 14 are connected to the external electrodes 20 and 22, respectively.

In this preferred embodiment, the exposed sections of the internal electrodes 14 are covered with the first and second insulating films 16 and 18, and the external electrodes 20 and 22 are further disposed on the films 16 and 18, respectively.

Figure 8:
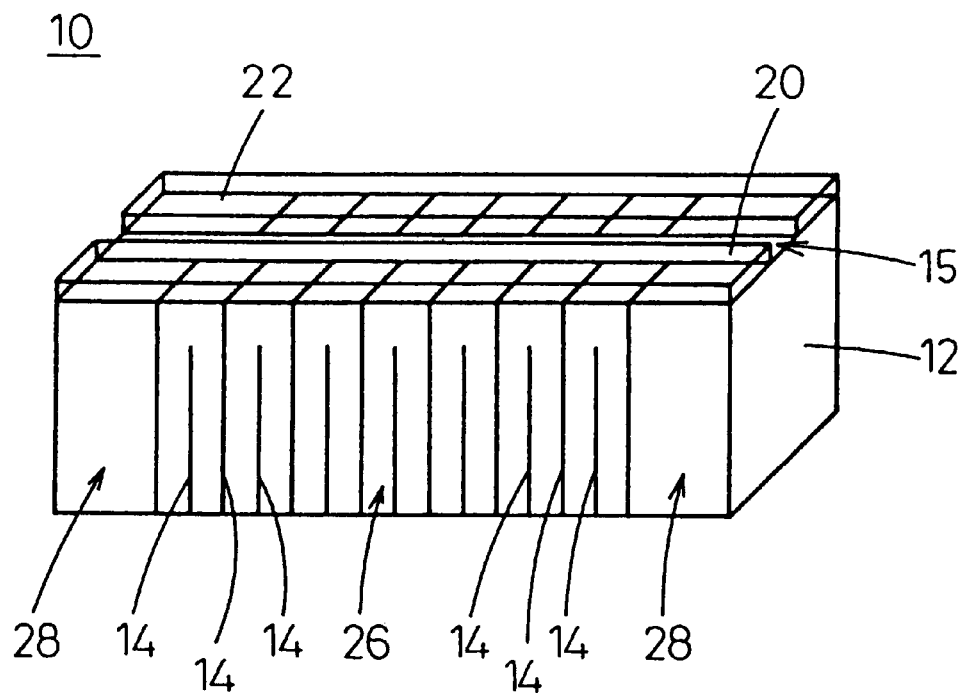
FIG. 8 is a perspective view illustrating the internal construction of an example of modifications of the piezoelectric resonator shown in FIGS. 1A, 1B, 2 and 3.
Figure 9:
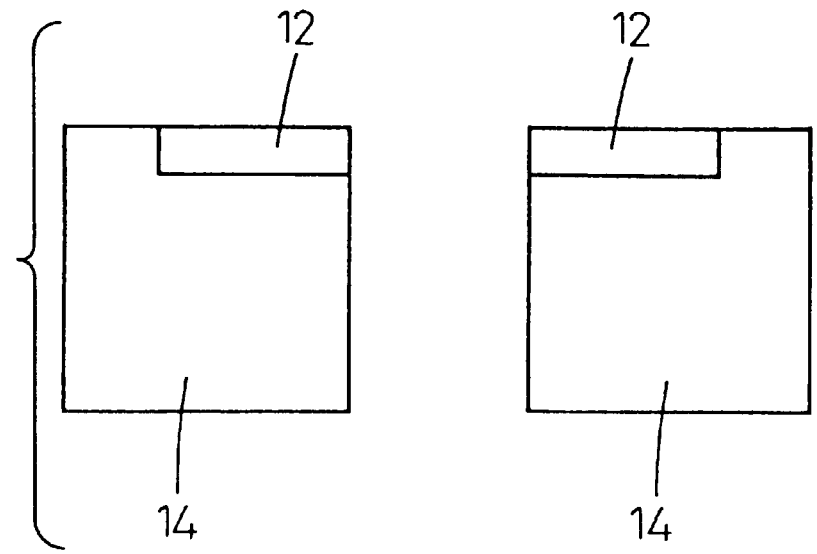
FIG. 9 is a cross sectional view of the base member used in the piezoelectric resonator shown in FIG. 8.

However, it is not necessary for the base member 12 to have a groove 15, as illustrated in FIG. 1B. More specifically, for example, on one lateral surface of the base member 12 illustrated in FIGS. 1A, 2 and 3, the insulating films 16 and 18 may alternately cover the exposed sections of the internal electrodes 14 at both ends of the base member 12 in the widthwise direction, and the external electrodes 20 and 22 may be disposed in two rows to extend along the base member 12 in the longitudinal direction. In this modification, although the base member 12 is not grooved, adjacent internal electrodes 14 are connected to the external electrodes 20 and 22, respectively. The internal electrodes 14 may be configured such that only part of the electrodes 14 connected to the external electrodes 20 and 22 are exposed from the surface of a laminated block of the piezoelectric resonator 10, and the other portions may not be exposed. In this case, the provision of the insulating films 16 and 18 is not particularly necessary, as illustrated in, for example, FIGS. 8 and 9.

The above-constructed resonator 10 uses the external electrodes 20 and 22 as input and output electrodes. The base member 12, except for the two opposite ends thereof, becomes piezoelectrically active because an electric field is applied between adjacent internal electrodes 14. The member 12 is preferably piezoelectrically inactive at each of the two opposite ends because it is not polarized therein and also because an electric field is not applied because of the absence of electrodes. As a result, an active section 26, which is responsive to input signals, is defined at the approximate center of the base member 12, while inactive sections 28, which are unresponsive to input signals, are formed at the two opposite ends of the member 12. The inactive sections 28 do not generate driving force in response to input signals. In the inactive portions 28, an electric field may be applied between the internal electrodes 14 as long as they are not polarized. Alternatively, the inactive portions 28 may be constructed in such a manner that the piezoelectric layers may be polarized as long as an electric field is not applied.

In this resonator 10, a signal is input to the external electrodes 20 and 22 so as to apply opposite voltages to the piezoelectric layers of the active section 26 polarized in the opposite directions. This causes the piezoelectric layers to expand and contract in the same direction as a whole. Thus, the piezoelectric resonator 10 vibrates as a whole integral unit in the longitudinal direction in the basic mode in which the center of the base member 12 serves as a node.

Figure 10:
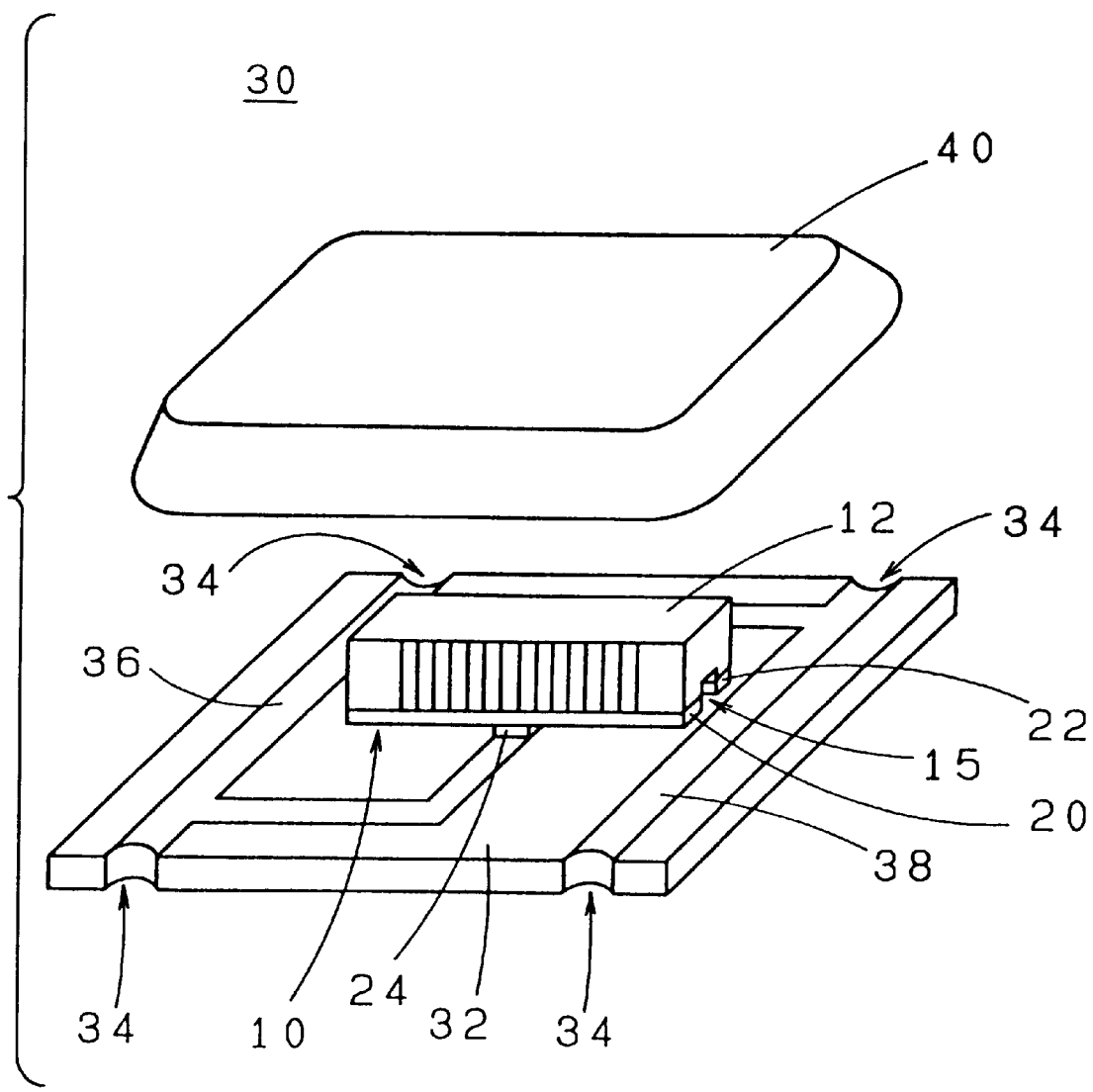
FIG. 10 is an exploded perspective view of an example of an electronic component using the piezoelectric resonator shown in FIGS. 1A, 1B, 2 and 3.

By use of the piezoelectric resonators, such as the resonator 10 shown in FIG. 1A, electronic components, such as oscillators and discriminators, can be produced. Referring to a perspective view of an example of electronic components shown in FIG. 10, an electronic component generally indicated by 30 has an insulating substrate 32. At each of the opposing end portions of the substrate 32, two indentations 34 are preferably formed. Disposed on one surface of the substrate 32 are two pattern electrodes 36 and 38. One pattern electrode 36 is formed between opposing indentations 34 and extends in substantially an "L" shape from a point near one end of the electrode 36 toward the center of the substrate 32. The other electrode 38 is disposed between the other opposing indentations 34 and extends in substantially an "L" shape from a point near one end of the electrode 38 (opposite to the one end of the electrode 36) toward the center of the substrate 32. In the vicinity of the central portion of the substrate 32, the pattern electrodes 36 and 38 are disposed to oppositely face each other with a space provided therebetween. The electrodes 36 and 38 are formed to be routed in a roundabout fashion from the ends of the substrate 32 to the reverse surface of the substrate 32.

Figure 11:
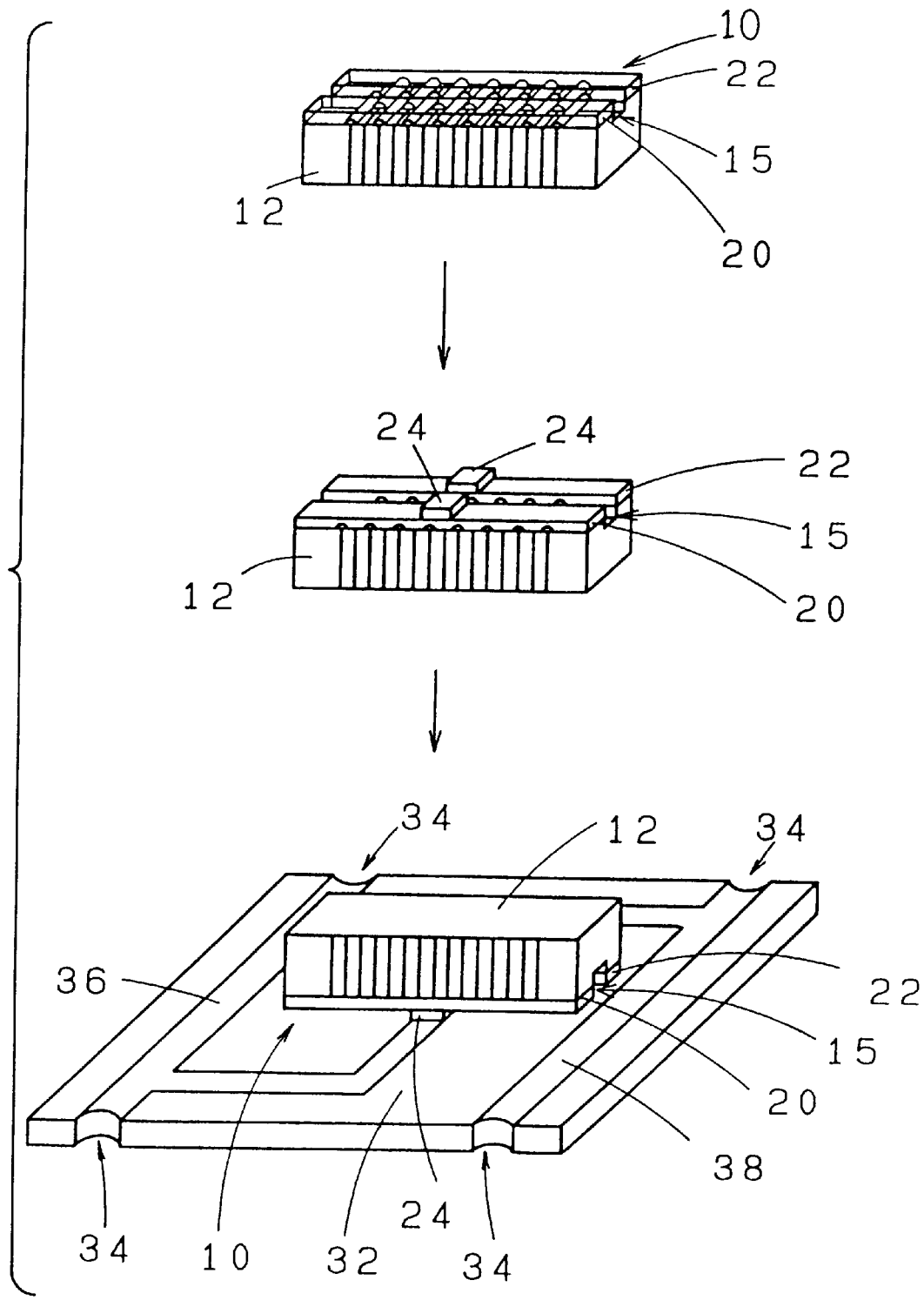
FIG. 11 is an exploded perspective view of a method for mounting the piezoelectric resonator on a substrate in the electronic component shown in FIG. 10.

The piezoelectric resonator 10 is preferably mounted on the insulating substrate 32 by support members 24. In other words, the support members 24 are preferably provided at the approximate central portions of the respective external electrodes 20 and 22. The support members 24 are formed so that they can become conductive. The support members 24 may be made from a conductive material, such as conductive adhesive. Alternatively, an insulator coated with an electrode film may adhere to each of the external electrodes 20 and 22 through a conductive material. Then, the support members 24 formed as noted above are, as illustrated in FIG. 11, connected through, for example, conductive adhesive (not shown), to the ends of the respective pattern electrodes 36 and 38 disposed at the center of the substrate 32. Thus, the external electrodes 20 and 22 of the resonator 10 can be securely mounted on the insulating substrate 32 and also electrically connected to the pattern electrodes 36 and 38, respectively.

Referring back to FIG. 10, a metallic cap 40 is preferably placed on the substrate 32 to complete the electronic component 30. In order to prevent the metallic cap 40 from being short-circuited to the pattern electrodes 36 and 38, insulating resin is preferably applied to the insulating substrate 32 and the pattern electrodes 36 and 38 in advance. In this component 30, the pattern electrodes 36 and 38, which are formed to be routed in a roundabout manner from the ends of the substrate 32 to the reverse surface of the substrate 32, are used as input and output terminals for connecting the resonator 10 to external circuits.

In this electronic component 30, when the length, width, and thickness of the resonator 10 are indicated by L, W and T, respectively, the dimensions of the piezoelectric resonator 10 are selected to satisfy the conditions of L24 2W and L≧2T. Accordingly, a difference between the resonant frequency and the anti-resonant frequency, i.e., ΔF, can be increased. Thus, in this electronic component 30, a large frequency difference $\Delta F/F_a$ and small spurious resonances can be achieved.

Also, in this component 30, since the piezoelectric resonator 10 is held by the support members 24 provided at the central portion of the longitudinal substrate 12, the ends of the resonator 10 can be disposed separately from the substrate 32, so that vibrations are not impeded. Additionally, the central portion of the resonator 10, which serves as a node, can be secured by the support members 24, and the external electrodes 20 and 22 are electrically connected to the pattern electrodes 36 and 38, respectively. Since the support members 24 have been formed on the resonator 10, they can be correctly positioned at the node of the resonator 10. Thus, the node can be supported more accurately by the support members 24 arranged as described above as compared with, for example, the following arrangement of support members. That is, support members in the form of, for example, projections, are formed on the pattern electrodes 36 and 38, and the piezoelectric resonator 10 is mounted on the support members. As a consequence, vibration leakage of the resonator 10 can be avoided, thereby obtaining good characteristics. Also, there is no need to use a lead wire to connect the external electrodes 20 and 22 of the resonator 10 to the pattern electrodes 36 and 38, respectively. Hence, the electronic component 30 can be manufactured with reduced cost.

The electronic component 30, together with IC chips, can be mounted on a substrate to form an oscillator or a discriminator. Since the electronic component 30 constructed as described above is sealed and protected by the metallic cap 40, it can be used as a chip-type surface-mountable component which is mountable by reflow soldering or other suitable method.

When this electronic component 30 using the above type of resonator 10 is provided in an oscillator, spurious vibrations are suppressed to a low level, which would otherwise cause unusual vibrations. It is also easy to achieve impedance matching with an external circuit since any desired level of capacitance can be set. Particularly when the electronic component 30 is used in an oscillator for voltage-controlled oscillation, a wide frequency variable range can be obtained due to a large frequency difference ΔF, which cannot be conventionally accomplished.

Moreover, when this electronic component 30 is used in a discriminator, a wide peak-separation range can be provided due to a large ΔF of the resonator. Additionally, it is easy to achieve impedance matching with an external circuit because of a wide capacitance range of the resonator.

Figure 12:
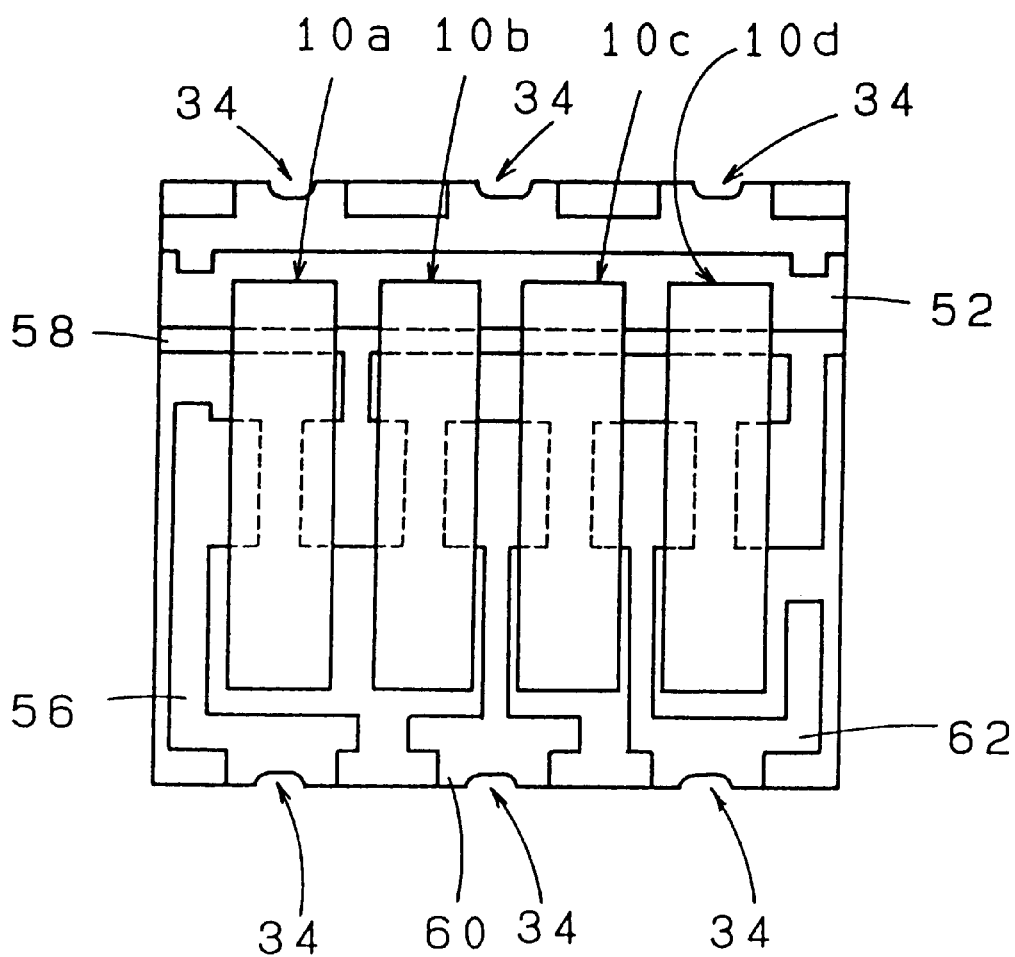
FIG. 12 is a plan view of the essential portion of an example of a ladder filter using the piezoelectric resonators of the preferred embodiments of the present invention.
Figure 13:
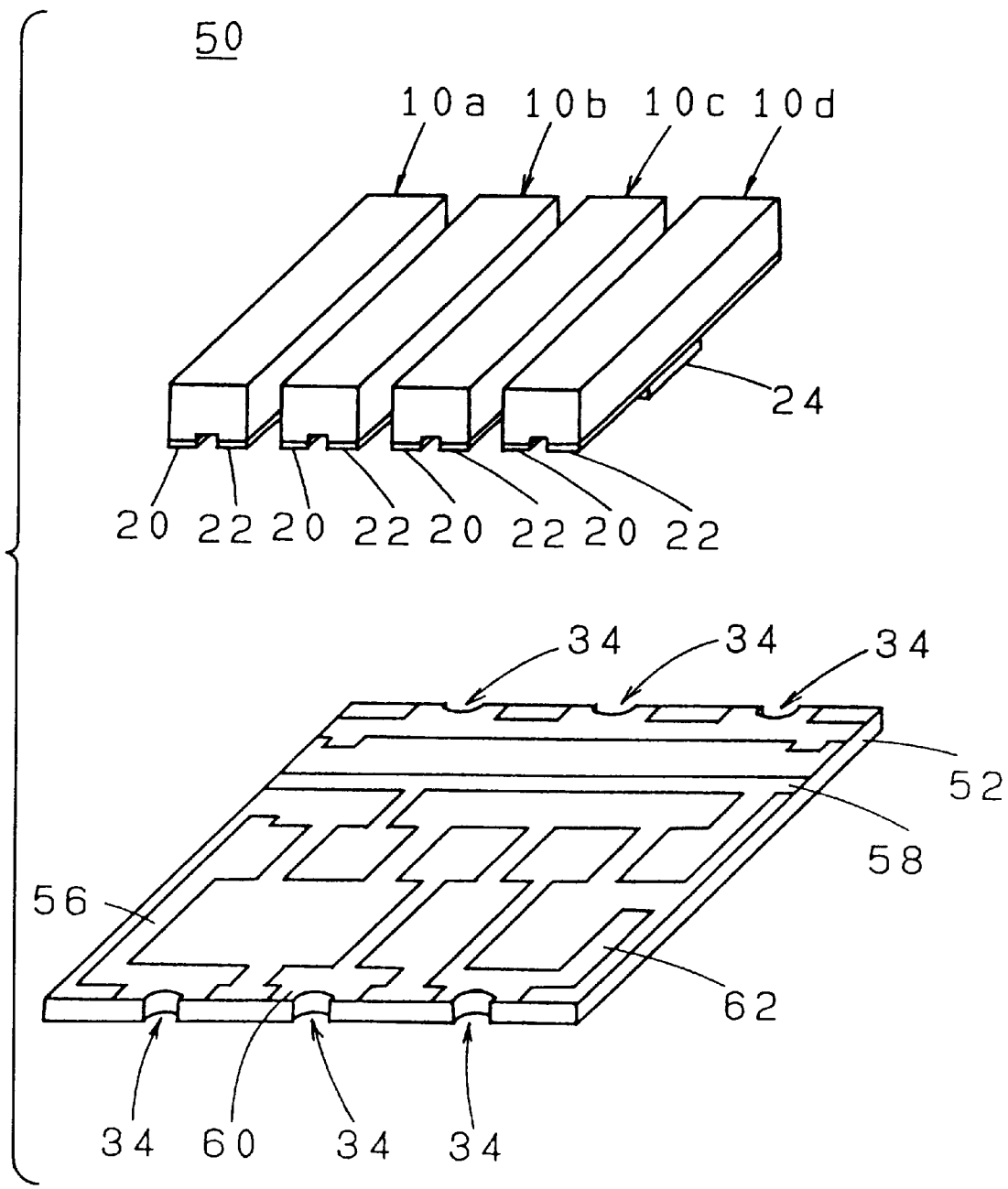
FIG. 13 is an exploded perspective view of the essential portion of the ladder filter shown in FIG. 12.

A ladder filter may be produced using a plurality of piezoelectric resonators 10. FIG. 12 is a plan view of the essential portion of an electronic component used as a ladder filter having a ladder-shaped circuit. FIG. 13 is an exploded perspective view of the electronic component shown in FIG. 12. In an electronic component generally designated by 50 shown in FIG. 13, four pattern electrodes 56, 58, 60 and 62 are formed on an insulating substrate 52. Five lands are provided for these pattern electrodes 56 through 62 in such a manner that they are disposed in a row at spaced intervals. More specifically, the first land at one end of the substrate 52 is provided for the pattern electrodes 56; the second and fifth lands are located at the electrode 58; the third land is disposed at the electrode 60; and the fourth land is provided for the electrode 62. Fixed to these lands are support members 24 mounted on the external electrodes 20 and 22 of the individual piezoelectric resonators 10a, 10b, 10c and 10d. In this case, the resonators 10a through 10d are mounted on the substrate 52 in such a manner that the ladder-shaped circuit illustrated in FIG. 14 can be obtained. Then, a metallic cap (not shown) is placed on the substrate 52.

Figure 14:
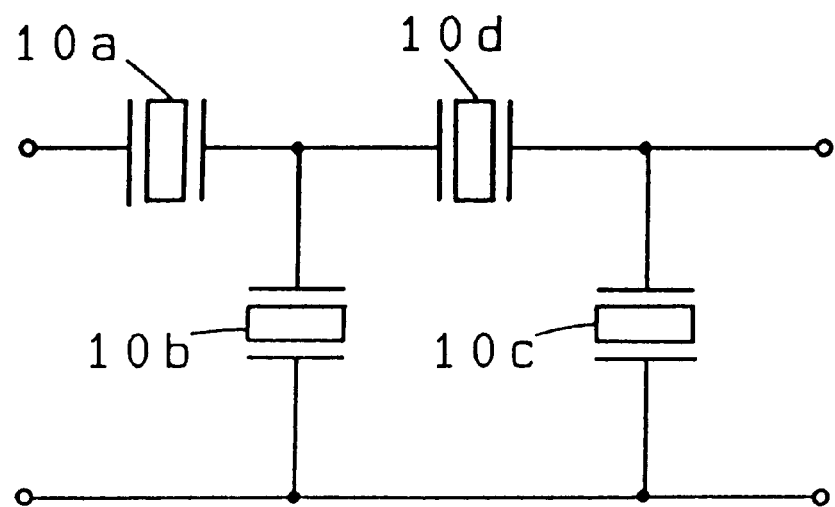
FIG. 14 is a diagram illustrating an equivalent circuit of the ladder filter shown in FIGS. 12 and 13.
Figure 15:
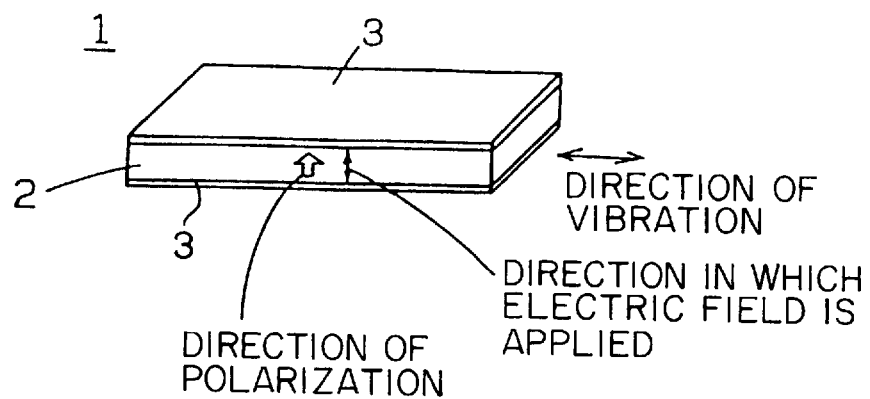
FIG. 15 illustrates a known type of unstiffened piezoelectric resonator.
Figure 16:
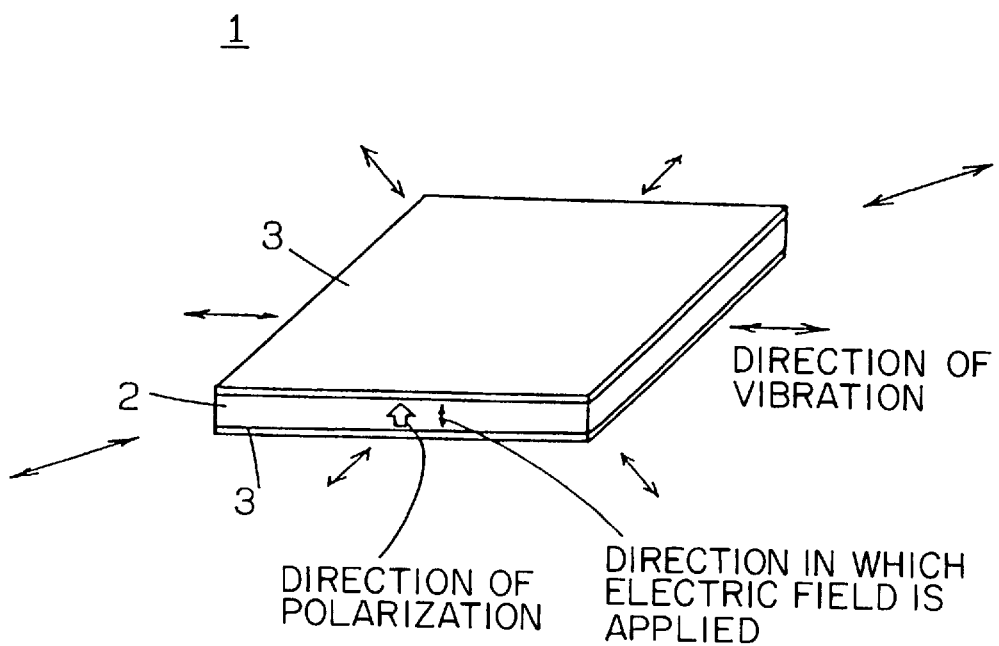
FIG. 16 illustrates a known type of stiffened piezoelectric resonator.

The electronic component 50 constructed as described above can thus be used as a ladder filter having a ladder-shaped circuit shown in FIG. 14. Two resonators 10a and 10d may be used as series piezoelectric resonators, while the other two resonators 10b and 10c may serve as parallel piezoelectric resonators. This type of ladder filter is designed so that the capacitance of the parallel resonators 10b and 10c is much larger than the capacitance of the series resonators 10a and 10d.

Attenuation in the ladder filter is determined by the capacitance ratio between the series resonators and the parallel resonators. When the lengths, widths, and thicknesses of the resonators 10a through 10d are represented by L, W and T, respectively, this electronic component 50, as well as the previous electronic component 30, is designed to satisfy the conditions of $L \geq 2W$ and $L \geq 2T$. Accordingly, the frequency difference $\Delta F$ can be increased. Hence, the electronic component 50 can exhibit large $\Delta F/F_a$ and small spurious resonances.

Further, in this electronic component 50, the capacitance can be adjusted by changing the number of laminated layers used in the piezoelectric resonators 10a through 10d. Thus, a ladder filter having a larger attenuation with fewer piezoelectric resonators can be implemented by changing the capacitance of the resonators 10a through 10d, as compared with a case where conventional unstiffened piezoelectric resonators are employed. Additionally, since the resonators 10a through 10d have a larger $\Delta F$ than known piezoelectric resonators, a wider pass bandwidth of a resulting ladder filter can be achieved as compared with a filter using conventional resonators.

As discussed in the foregoing preferred embodiments, according to the present invention, when the length, width, and thickness of the piezoelectric resonator 10 are indicated by L, W and T, respectively, the dimensions of the resonator 10 are determined, in particular, to satisfy the conditions of $L \geq 2W$ and $L \geq 2T$. Accordingly, the characteristics of the resonator 10, such as the capacitance, can be easily regulated. As a consequence, a resonator 10 having a high level of flexibility in designing the resonator characteristics can be obtained. To further develop this resonator 10, the electronic components 30 and 50 using the resonator 10 can be attained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
    a base member;
    a plurality of internal electrodes disposed within said base member arranged to be substantially perpendicular to a longitudinal direction of said base member along a longitudinal axis of the base member;
    a pair of external electrodes provided on one of a common lateral surface or different lateral surfaces of said base member so as to be connected to said plurality of internal electrodes;
    means for driving said base member by applying an electric field to said base member for vibrating said base member; wherein
    said base member has a laminated structure including a plurality of piezoelectric layers and said plurality of internal electrodes being alternately laminated, said piezoelectric layers being polarized in the longitudinal direction of said base member and generating longitudinal vibration in said base member when said means for driving applies the electric field in the longitudinal direction of said base member such that a vibration node of the piezoelectric base member is defined approximately at a center portion of the base member; and
    dimensions of said piezoelectric resonator satisfy the conditions of $L22$ $2W$ and $L>2T$ when a length, width and thickness of said piezoelectric resonator are indicated by L, W and T, respectively.

2. A piezoelectric resonator according to claim 1, wherein said plurality of internal electrodes are disposed along an entire cross sectional surface of said base member, and a pair of connecting portions are defined by covering at least parts of said internal electrodes which are exposed at the lateral surface of said base member with alternate insulating films, said pair of external electrodes being provided on said pair of connecting portions, whereby adjacent ones of said internal electrodes are connected to alternate ones of said pair of external electrodes, respectively.

3. A piezoelectric resonator according to claim 1, wherein said plurality of internal electrodes are partially formed in such a manner that each of said internal electrodes includes a first portion which is exposed at the lateral surface of the base member at a location of a first one of said pair of external electrodes and a second portion which is not exposed at the lateral surface of said base member at a location of a second one of said pair of external electrodes, said first portions of said plurality of internal electrodes are connected to said pair of external electrodes, whereby adjacent ones of said internal electrodes are connected to alternate ones of said pair of external electrodes, respectively.

4. An electronic component comprising:
    a piezoelectric resonator which includes a base member, a plurality of internal electrodes disposed within said base member arranged to be substantially perpendicular to a longitudinal direction of said base member along a longitudinal axis of the base member, and a pair of external electrodes provided on one of a common lateral surface or different lateral surfaces of said base member so as to be connected to said plurality of internal electrodes, said base member having a laminated structure including a plurality of piezoelectric layers and said plurality of internal electrodes being alternately laminated;
    means for driving said base member by applying an electric field to said base member for vibrating said base member;
    said piezoelectric layers being polarized in the longitudinal direction of said base member and generating longitudinal vibration in said base member when said means for driving applies the electric field in the longitudinal direction of said base member such that a vibration node of the piezoelectric base member is defined approximately at a center portion of the base member, wherein dimensions of said piezoelectric resonator satisfy the conditions of L>2W and L>2T when a length, width and thickness of said piezoelectric resonator are indicated by L, W and T, respectively;

a support substrate for supporting said piezoelectric resonator;

a support member disposed between said piezoelectric resonator and said support substrate for supporting said piezoelectric resonator on said support substrate; and a cap disposed on said support substrate to cover said piezoelectric resonator.

5. An electronic component according to claim 4, wherein said plurality of internal electrodes of said piezoelectric resonator are disposed along an entire cross sectional surface of said base member, and a pair of connecting portions are defined by covering at least parts of said internal electrodes which are exposed at the lateral surface of said base member with alternate insulating films, said pair of external electrodes being disposed on said pair of connecting portions, whereby adjacent ones of said internal electrodes are connected to said pair of external electrodes, respectively.

6. An electronic component according to claim 4, wherein said plurality of internal electrodes are partially formed in such a manner that each of said internal electrodes includes a first portion which is exposed at the lateral surface of the base member at a location of a first one of said pair of external electrodes and a second portion which is not exposed at the lateral surface of said base member at a location of a second one of said pair of external electrodes, said first portions of said plurality of internal electrodes are connected to said pair of external electrodes, whereby adjacent ones of said internal electrodes are connected to alternate ones of said pair of external electrodes, respectively.

7. An electronic component according to claim 4, wherein a plurality of said piezoelectric resonators are connected on said support substrate to define a ladder filter.

8. A piezoelectric resonator comprising:

a base member including a plurality of piezoelectric layers and a plurality of internal electrodes defining a single integral unit;

means for driving said base member by applying an electric field to said base member for vibrating said base member;

said piezoelectric layers being polarized and arranged to generate longitudinal vibration in said base member along a longitudinal axis of the base member and such that a vibration node of the piezoelectric base member is defined approximately at a center portion of the base member when said means for driving applies the electric field in the longitudinal direction of said base member; and a pair of external electrodes provided on said base member so as to be connected to said plurality of internal electrodes; wherein dimensions of said piezoelectric resonator satisfy the conditions of L>2W and L>2T when a length, width and thickness of said piezoelectric resonator are indicated by L, W and T, respectively.

9. A piezoelectric resonator according to claim 8, wherein said plurality of internal electrodes are disposed along an entire cross sectional surface of said base member, and a pair of connecting portions are defined by covering at least parts of said internal electrodes which are exposed at the lateral surface of said base member with alternate insulating films, said pair of external electrodes being provided on said pair of connecting portions, whereby adjacent ones of said internal electrodes are connected to alternate ones of said pair of external electrodes, respectively.

10. A piezoelectric resonator according to claim 8, wherein said plurality of internal electrodes are partially formed in such a manner that each of said internal electrodes includes a first portion which is exposed at the lateral surface of the base member at a location of a first one of said pair of external electrodes and a second portion which is not exposed at the lateral surface of said base member at a location of a second one of said pair of external electrodes, said first portions of said plurality of internal electrodes are connected to said pair of external electrodes, whereby adjacent ones of said internal electrodes are connected to alternate ones of said pair of external electrodes, respectively.

11. An electronic component comprising:

a piezoelectric resonator including a base member including a plurality of piezoelectric layers and a plurality of internal electrodes defining a single integral unit;

means for driving said base member by applying an electric field to said base member for vibrating said base member;

said piezoelectric layers being polarized and arranged to be generate longitudinal vibration in said base member along a longitudinal axis of the base member and such that a vibration node of the piezoelectric base member is defined approximately at a center portion of the base member when said means for driving applies the electric field of the longitudinal direction of said base member, a pair of external electrodes provided on said base member so as to be connected to said plurality of internal electrodes, wherein dimensions of said piezoelectric resonator satisfy the conditions of L>2W and L>2T when a length, width and thickness of said piezoelectric resonator are indicated by L, W and T, respectively;

a support substrate for supporting said piezoelectric resonator;

a support member disposed between said piezoelectric resonator and said support substrate for supporting said piezoelectric resonator on said support substrate; and a cap disposed on said support substrate to cover said piezoelectric resonator.

12. An electronic component according to claim 11, wherein said plurality of internal electrodes of said piezoelectric resonator are disposed along an entire cross sectional surface of said base member, and a pair of connecting portions are defined by covering at least parts of said internal electrodes which are exposed at the lateral surface of said base member with alternate insulating films, said pair of external electrodes being disposed on said pair of connecting portions, whereby adjacent ones of said internal electrodes are connected to alternate ones of said pair of external electrodes, respectively.

13. An electronic component according to claim 11, wherein said plurality of internal electrodes are partially formed in such a manner that each of said internal electrodes includes a first portion which is exposed at the lateral surface of the base member at a location of a first one of said pair of external electrodes and a second portion which is not exposed at the lateral surface of said base member at a location of a second one of said pair of external electrodes, said first portions of said plurality of internal electrodes are connected to said pair of external electrodes, whereby adjacent ones of said internal electrodes are connected to alternate ones of said pair of external electrodes, respectively.

14. An electronic component according to claim 11, wherein a plurality of said piezoelectric resonators are connected on said support substrate to define a ladder filter.

* * * * *